US011505450B2

(12) United States Patent
Brandl et al.

(10) Patent No.: US 11,505,450 B2
(45) Date of Patent: Nov. 22, 2022

(54) INTEGRATION OF STRESS DECOUPLING AND PARTICLE FILTER ON A SINGLE WAFER OR IN COMBINATION WITH A WAFERLEVEL PACKAGE

(71) Applicant: Infineon Technologies AG, Neubiberg (DE)

(72) Inventors: Florian Brandl, Maxhütte-Haidhof (DE); Christian Geissler, Teugn (DE); Robert Gruenberger, Nandlstadt (DE); Claus Waechter, Sinzing (DE); Bernhard Winkler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 156 days.

(21) Appl. No.: 17/076,250

(22) Filed: Oct. 21, 2020

(65) Prior Publication Data

US 2021/0032097 A1 Feb. 4, 2021

Related U.S. Application Data

(62) Division of application No. 16/387,918, filed on Apr. 18, 2019, now Pat. No. 10,899,604.

(51) Int. Cl.
*B81B 7/00* (2006.01)
*B81C 1/00* (2006.01)
*G01L 1/18* (2006.01)
*G01L 1/14* (2006.01)

(52) U.S. Cl.
CPC ........ *B81B 7/0016* (2013.01); *B81C 1/00666* (2013.01); *G01L 1/14* (2013.01); *G01L 1/18* (2013.01); *B81B 2201/0264* (2013.01); *B81B 2207/095* (2013.01); *B81C 2201/013* (2013.01); *B81C 2203/0109* (2013.01)

(58) Field of Classification Search
CPC .......... B81B 7/0016; B81B 2201/0264; B81B 2207/095; B81C 1/00666; B81C 2201/013; B81C 2203/0109; G01L 1/14; G01L 1/18
USPC ........................................................ 257/417
See application file for complete search history.

(56) References Cited

U.S. PATENT DOCUMENTS

| 2012/0264250 A1* | 10/2012 | Graham ................ G01L 9/0042 257/E21.214 |
| 2014/0353772 A1* | 12/2014 | Stermer, Jr ......... B81C 1/00325 438/51 |
| 2017/0073218 A1* | 3/2017 | Kaanta .................. B81B 7/0048 |

* cited by examiner

*Primary Examiner* — Matthew E. Gordon
(74) *Attorney, Agent, or Firm* — Harrity & Harrity, LLP

(57) ABSTRACT

A semiconductor device and a method of manufacturing the same are provided. The semiconductor device includes a substrate having a first surface and a second surface arranged opposite to the first surface; a stress-sensitive sensor disposed at the first surface of the substrate, where the stress-sensitive sensor is sensitive to mechanical stress; a stress-decoupling trench that has a vertical extension that extends from the first surface into the substrate, where the stress-decoupling trench vertically extends partially into the substrate towards the second surface although not completely to the second surface; and a plurality of particle filter trenches that vertically extend from the second surface into the substrate, wherein each of the plurality of particle filter trenches have a longitudinal extension that extends orthogonal to the vertical extension of the stress-decoupling trench.

9 Claims, 8 Drawing Sheets

Section A-A

Section B-B

Section C-C

INTEGRATION OF STRESS DECOUPLING AND PARTICLE FILTER ON A SINGLE WAFER OR IN COMBINATION WITH A WAFERLEVEL PACKAGE

CROSS-REFERENCE TO RELATED APPLICATIONS

This application is a divisional of U.S. patent application Ser. No. 16/387,918 filed Apr. 18, 2019, which is incorporated by reference as if fully set forth.

FIELD

The present disclosure relates generally to semiconductor devices and a method of manufacturing the same, and, more particularly, stress-sensitive sensors with a stress relief mechanism.

BACKGROUND

Microelectromechanical systems (MEMS) are microscopic devices, particularly those with moving parts. MEMS became practical once they could be fabricated using modified semiconductor device fabrication technologies, normally used to make electronics. Thus, a MEMS may be built into a substrate as a component of an integrated circuit, that is diced into a semiconductor chip that is subsequently mounted in a package.

Mechanical stress, including stress generated by a chip package, and external mechanical influences introduced to a package may inadvertently be transferred through the package to an integrated MEMS element, such as sensor, and, more particularly, to a pressure sensor. This transferred mechanical stress may affect the operation of the MEMS element or induce a shift (e.g., an offset) in a sensor signal that may lead to incorrect measurements.

For example, semiconductor pressure sensors have a pressure sensitive element arranged to measure an absolute pressure or a relative pressure (e.g. the difference between two pressures). A problem with many pressure sensors is that the sensor measures (or outputs, or gives) a signal, even in the absence of a pressure (or pressure difference) to be measured. This offset may be the result of mechanical stress and/or deformation of the housing (e.g., the packaging) of the sensor. The housing-stress/deformation will typically also cause a stress-component at the sensor surface where the sensitive elements (e.g., piezo-resistors) are located, and thereby cause an offset error, a linearity error, or even a hysteresis error to the output signal.

Therefore, an improved device capable of decoupling mechanical stress from an integrated MEMS element may be desirable.

SUMMARY

Embodiments provide semiconductor devices and a method of manufacturing the same, and, more particularly, stress-sensitive sensors with a stress relief mechanism.

One or more embodiments provide a semiconductor device that includes a substrate having a first surface and a second surface arranged opposite to the first surface; a first stress-sensitive sensor disposed at the first surface of the substrate, wherein the first stress-sensitive sensor is sensitive to mechanical stress; a first stress-decoupling trench that has a vertical extension that extends from the first surface into the substrate, wherein the first stress-decoupling trench vertically extends partially into the substrate towards the second surface although not completely to the second surface; and a plurality of particle filter trenches that vertically extend from the second surface into the substrate, wherein each of the plurality of particle filter trenches have a longitudinal extension that extends orthogonal to the vertical extension of the first stress-decoupling trench, and wherein each of the plurality of particle filter trenches is separated from an adjacent particle filter trench of the plurality of particle filter trenches by a backside portion of the substrate that extends from the second surface to a bottom of the first stress-decoupling trench.

One or more further embodiments provide a method of manufacturing a semiconductor device. The method includes performing a frontend fabrication of a semiconductor substrate having a first surface and a second surface arranged opposite to the first surface, the frontend fabrication including integrating a first stress-sensitive sensor disposed at the first surface of the substrate, and forming a first stress-decoupling trench in the substrate, wherein the first stress-decoupling trench has a vertical extension that extends from the first surface into the substrate, wherein the first stress-decoupling trench vertically extends partially into the substrate towards the second surface although not completely to the second surface; and forming a plurality of particle filter trenches at the second surface of the substrate, wherein the plurality of particle filter trenches vertically extend from the second surface into the substrate, wherein each of the plurality of particle filter trenches have a longitudinal extension that extends orthogonal to the vertical extension of the first stress-decoupling trench, and wherein each of the plurality of particle filter trenches is separated from an adjacent particle filter trench of the plurality of particle filter trenches by a backside portion of the substrate that extends from the second surface to a bottom of the first stress-decoupling trench.

BRIEF DESCRIPTION OF THE DRAWINGS

Embodiments are described herein making reference to the appended drawings.

DETAILED DESCRIPTION

Figure 1A:
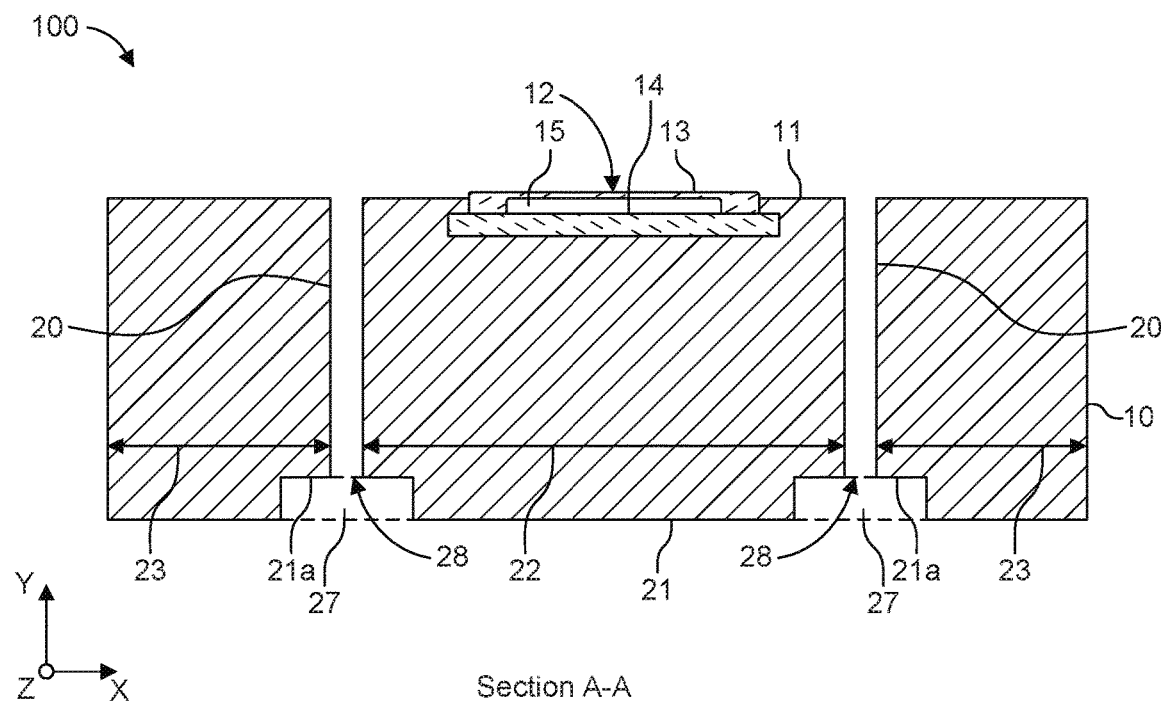
FIG. 1A shows a vertical cross-sectional diagram of a chip according to one or more embodiments, taken along line A-A in FIGS. 1B and 1C.

In the following, various embodiments will be described in detail referring to the attached drawings, where like reference numerals refer to like elements throughout. It should be noted that these embodiments serve illustrative purposes only and are not to be construed as limiting. For example, while embodiments may be described as comprising a plurality of features or elements, this is not to be construed as indicating that all these features or elements are needed for implementing embodiments. Instead, in other embodiments, some of the features or elements may be omitted, or may be replaced by alternative features or elements. Additionally, further features or elements in addition to the ones explicitly shown and described may be provided, for example conventional components of sensor devices.

Features from different embodiments may be combined to form further embodiments, unless specifically noted otherwise. Variations or modifications described with respect to one of the embodiments may also be applicable to other embodiments. In some instances, well-known structures and devices are shown in block diagram form rather than in detail in order to avoid obscuring the embodiments.

Connections or couplings between elements shown in the drawings or described herein may be wire-based connections or wireless connections unless noted otherwise. Furthermore, such connections or couplings may be direct connections or couplings without additional intervening elements or indirect connections or couplings with one or more additional intervening elements, as long as the general purpose of the connection or coupling, for example to transmit a certain kind of signal or to transmit a certain kind of information, is essentially maintained.

One or more embodiments relate to stress-sensitive sensors integrated in a semiconductor chip and subsequently mounted to a package. Stress-sensitive sensors include microelectromechanical systems (MEMS) stress sensors, including MEMS pressure sensors. The MEMS may be referred to as a MEMS element or MEMS device, and may include, for example, capacitive MEMS sensor devices or piezo-resistive MEMS sensor devices.

The package may be adapted to enable a MEMS pressure sensor to detect and/or measure a force imposed thereon. For example, the MEMS pressure sensor may operate as a transducer that generates an electrical signal as a function of the pressure imposed, and the package may have an opening formed in proximity to the MEMS pressure sensor that allows a medium to interact with the MEMS pressure sensor. The medium may be any pressure measurable or pressure inducing entity.

In general, a sensor, as used herein, may refer to a component which converts a physical quantity to be measured to an electric signal, for example a current signal or a voltage signal. The physical quantity may for example comprise a magnetic field, an electric field, a pressure, a force, a temperature, a current, or a voltage, but is not limited thereto. A sensor device, as described herein, may be a voltage sensor, a current sensor, a temperature sensor, a magnetic sensor, and the like. The physical quantity may, for example, be pressure as an expression of force imposed on a sensitive area or region of the sensor Thus, the sensor may directly measure and/or detect stress, and generate a sensor signal based on the detected stress.

Alternatively, the sensor may generate a sensor signal based on some other physical quantity (e.g., a Hall sensor sensitive to a magnetic field). In this case. mechanical stress transferred to the sensor may adversely affect the sensor signal (e.g., based on a purely parasitic effect). Thus, the sensor could be said to have indirectly measured and/or detected stress.

Thus, a stress-sensitive sensor is any sensor that is sensitive to mechanical stress, either directly or indirectly, in a way that impacts the sensor signal. Stress sensitive sensors include both MEMS sensors and non-MEMS sensors. While some examples are directed to MEMS sensors for the stress-sensitive sensor, it will be appreciated that MEMS sensors and non-MEMS sensors may be regarded as interchangeable.

Debris, such as foreign particles, may negatively impact the performance of any sensor. Thus, it may be desirable to prevent debris from reaching the surface of the sensor, and, specifically, from reaching the sensitive area or region of the sensor and prevent particles from reaching (and blocking) stress decoupling trenches.

A manufacturing process for semiconductor chip fabrication may include two sequential sub-processes commonly referred to as front-end and back-end production. The back-end production may further include two sequential sub-processes commonly referred to as pre-assembly and assembly.

Front-end production refers primarily to wafer fabrication. A wafer, as used herein, may also be referred to as a substrate. The front-end production may start with a clean disc-shaped silicon wafer that will ultimately become many silicon chips. First, a photomask that defines the circuit patterns for circuit elements (e.g., transistors) and interconnect layers may be created. This mask may then be laid on the clean silicon wafer and is used to map the circuit design. Transistors and other circuit elements may then be formed on the wafer through photolithography. Photolithography involves a series of steps in which a photosensitive material is deposited on the wafer and exposed to light through a patterned mask; unwanted exposed material is then etched away, leaving only the desired circuit pattern on the wafer. By stacking the various patterns, individual elements of the semiconductor chip may be defined. A stress-sensitive sensor, which may be a MEMS device or a MEMS element, may also be incorporated onto and/or into the surface of the wafer and connected to one or more circuit elements. During the final phase of the front-end production process, each individual chip on the wafer is electrically tested to identify properly functioning chips for assembly.

Back-end production refers to the assembly and test of individual semiconductor devices or chips. The assembly process is intended to protect the chip, facilitate its integration into electronic systems, limit electrical interference and enable the dissipation of heat from the device. Once the front-end production process is complete, the wafer is sawed or diced into individual semiconductor chips. This dicing of the wafer into individual semiconductor chips is referred to as pre-assembly.

In an assembly phase of the back-end production, the semiconductor chips are incorporated into a package. For example, these semiconductor chips may be individually attached by means of an alloy or an adhesive to a lead frame, a metallic device used to connect the semiconductor to a circuit board. Leads on the lead frame may then be connected by aluminum or gold wires to the input/output terminals on the semiconductor chip through the use of automated machines known as wire bonders. Each semiconductor device may then be at least partially encapsulated in a plastic molding compound or a ceramic case, forming the package.

Thus, a MEMS element or other stress-sensitive sensor may be built into a substrate as a component of an integrated circuit, the substrate then being diced into semiconductor chips that are each subsequently mounted in a package.

It will be appreciated that while the pre-assembly (i.e., dicing) process may be described as part of the back-end production flow, the chips may be partially singulated during final phase of the front-end production. Thus, in some instances, pre-assembly may begin or may be performed during the front-end production.

According to one or more embodiments, mechanical stress-decoupling is provided to a stress-sensitive sensor as a stress relief mechanism. A stress-decoupling feature such as one or more trenches (i.e., one or more stress-decoupling trenches) may be provided. In additional, each stress-decoupling trench may be filled with a gel (e.g., a silicone gel) and the gel may additionally be deposited over the stress-sensitive sensor at the wafer level (i.e., during the front-end production process), or during or subsequent to the pre-assembly process, including prior to or subsequent to packaging. The protective material may be deposited on an exposed surface of the stress-sensitive sensor such that an entire exposed surface of the stress-sensitive sensor is covered by the protective material.

The exposed surface of the stress-sensitive sensor may include or may be referred to as a sensitive area that enables the stress-sensitive sensor to measure a physical quantity. For example, the stress-sensitive sensor may be a MEMS pressure sensor that is configured to detect or measure a change in pressure in response to a change of force imposed on the exposed surface. The protective material is configured such that, when the stress-sensitive sensor is covered by the protective material, a sensor functionality of the stress-sensitive sensor remains intact. For example, the protective material may be a silicone gel that has an elastic modulus and/or a Poisson's ratio that permits a force exerted thereon to be transferred to the MEMS pressure sensor. Thus, the protective material is flexible enough that when the protective material is depressed, the sensitive area of the MEMS pressure sensor is also depressed proportionally.

More particularly, the protective material permits full sensor functionality of the stress-sensitive sensor, including mechanical functionality and electrical functionality, while sealing an entire surface of the stress-sensitive sensor. Even more particularly, the protective material is configured such that no functionality of the stress-sensitive sensor is impeded by the protective material.

By ensuring that the functionality of the stress-sensitive sensor remains intact, the protective material may be deposited onto the stress-sensitive sensor as a permanent material at an early stage of the chip fabrication process. Thus, the stress-sensitive sensor may already be configured in an operable state (e.g., a final operable state) at the time the protective material is deposited onto the stress-sensitive sensor, and the protective material may remain completely intact after deposition, including throughout the assembly process, such that it remains a feature in the final product.

As a result of the early deposition of the protective material, the stress-sensitive sensor is provided early particle and humidity protection from foreign matter that may have been introduced during (pre-)assembly processes that could influence the sensor performance.

While some embodiments provided herein may refer to the protective material as being a temperature hardening gel (e.g., silicone gel), others may use a ultraviolet (UV) hardening gel. However, the protective material is not limited thereto, and may be any material that provides protection from foreign matter while permitting sensor functionality of the stress-sensitive sensor, and more particularly permits sensor functionality of the stress-sensitive sensor at the time of deposition of the protective material. Thus, the protective material may be any protective gel.

Figure 1B:
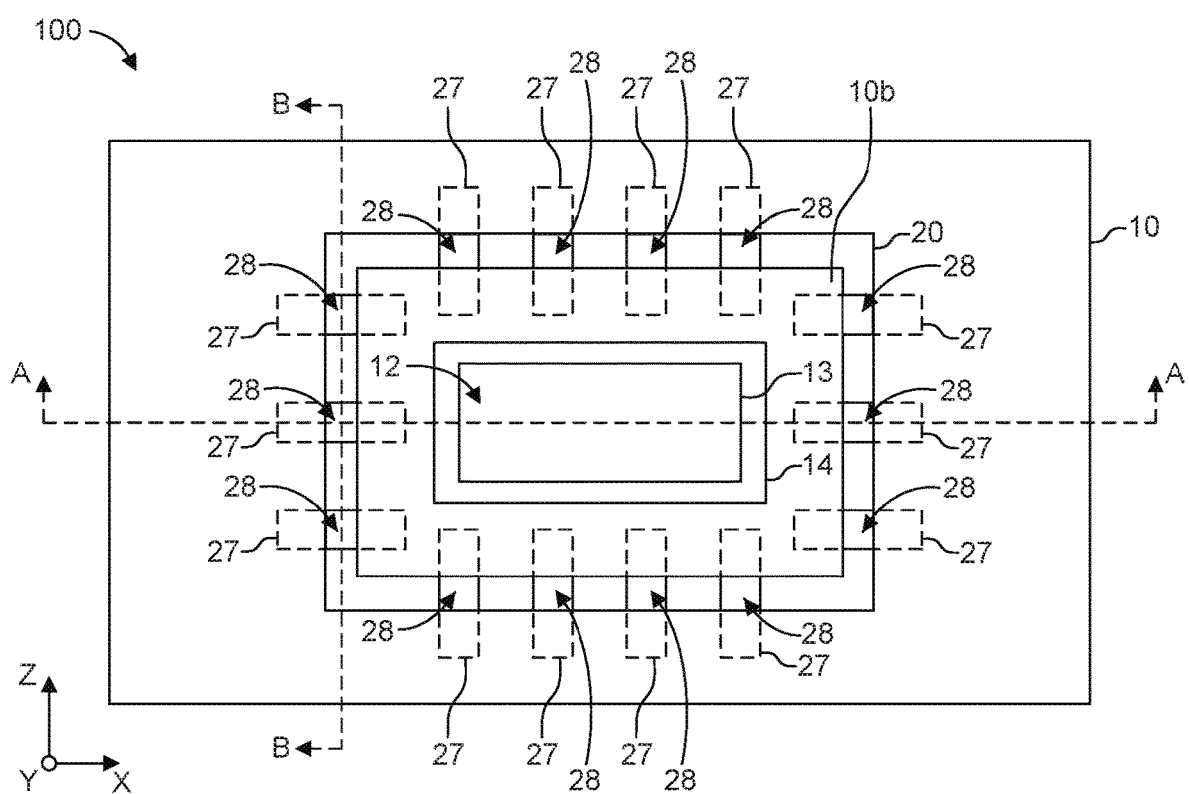
FIGS. 1B and 1C illustrate a top-view and a bottom-view of the chip shown in FIG. 1A, respectively, according to one or more embodiments.
Figure 1C:
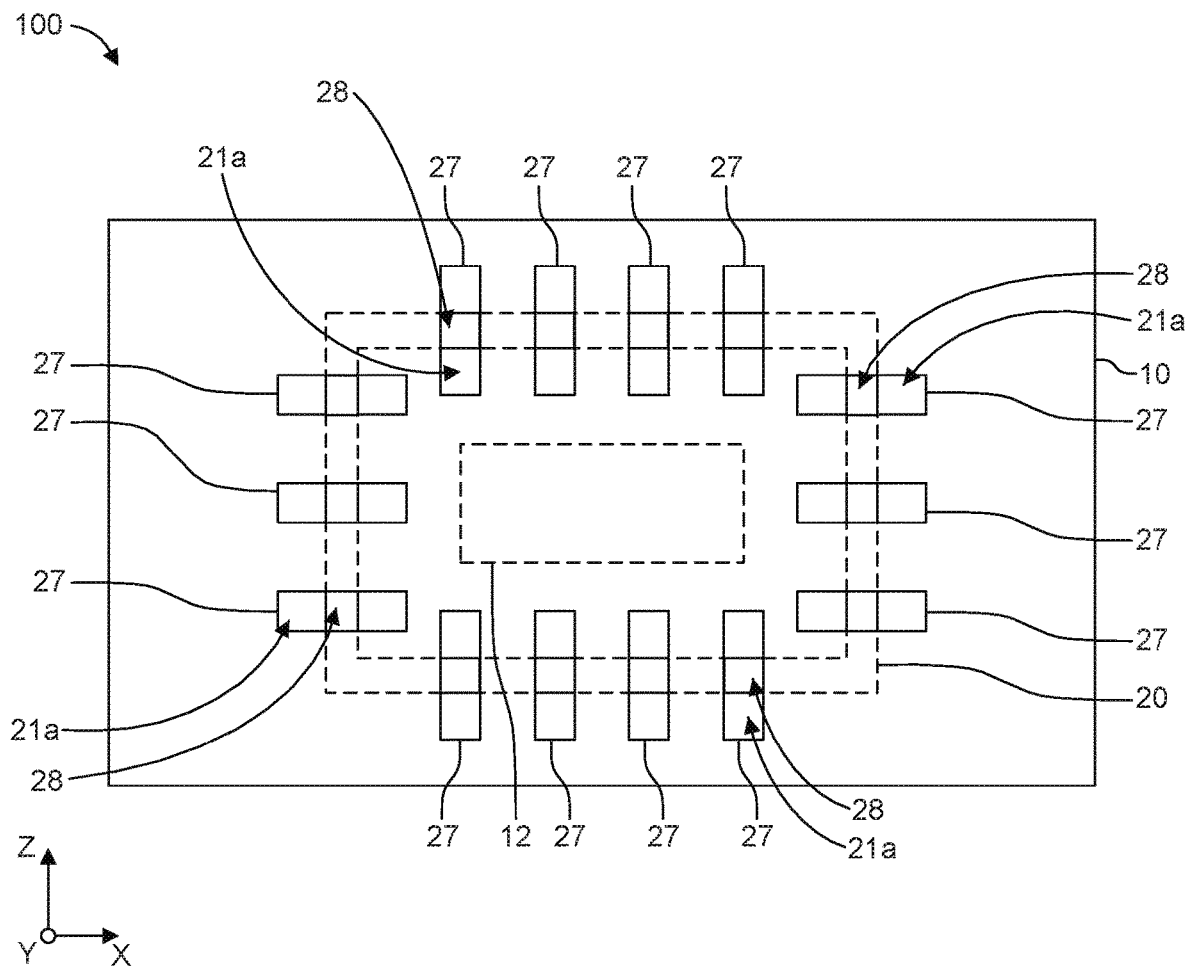
Figure 1D:
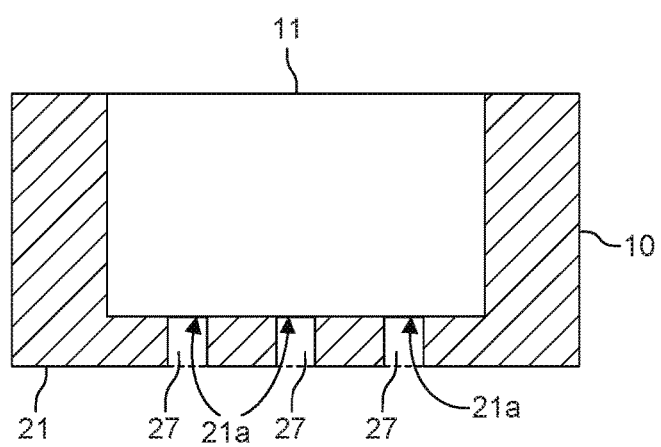
FIG. 1D shows a vertical cross-sectional diagram of a chip according to one or more embodiments, taken along line B-B in FIGS. 1B and 1C.

FIG. 1A shows a vertical cross-sectional diagram of a chip 100 according to one or more embodiments. Specifically, FIG. 1A is a cross-section taken along line A-A shown in FIGS. 1B and 1C. FIGS. 1B and 1C illustrate a top-view and a bottom-view of the chip 100 shown in FIG. 1A, respectively, according to one or more embodiments. FIG. 1D is a vertical cross-sectional diagram of chip 100 taken along line B-B shown in FIGS. 1B and 1C.

The chip 100 includes a semiconductor substrate 10 (e.g., a silicon substrate) having a first main surface 11 at the frontside of the chip 100 and a second main surface 12 21 at the backside of the chip 10, opposite to the frontside. The chip further includes a MEMS element 12 integrated at the main surface 11.

In this example, the MEMS element 12 may be a capacitive MEMS element 12 that includes two parallel conductive plates: a top electrode 13 and a bottom electrode 14, separated by a dielectric material 15. For example, the dielectric material 15 may be a vacuum where a cavity is formed between the top electrode 13 and the bottom electrode 14. The vacuum serves as a reference pressure for the pressure sensor. A dielectric layer (not illustrated) may also be disposed between the electrodes 13 and 14 (e.g., on the upper surface of the bottom electrode 14).

The electrodes 13 and 14 form a capacitive element having a baseline or reference capacitance when no pressure is applied to the MEMS element 12. The top electrode 13 is flexible and pressure sensitive, where as the bottom electrode is rigid and fixed being located on the rigid substrate 10 beneath and/or around it. The top electrode 13 may be a sensitive diaphragm or membrane and the cavity is formed between the fixed, bottom electrode 14 plate and the movable electrode 13 to allow deflection of the diaphragm or membrane. When pressure is applied onto the sensitive diaphragm, the cavity enclosed between the two parallel electrodes 13 and 14 reduces in volume as the sensitive diaphragm deflects and approaches the stationary one, resulting in a detectable change in the capacitance between the electrodes 13 and 14 corresponding the to applied pressure. The change in capacitance is a readable value through an electrical signal.

Alternatively, the MEMS element 12 may be another type of integrated pressure sensor or another type of stress-sensitive sensor. Accordingly, each MEMS element 12 may occupy a MEMS area of the substrate 10 and includes at least one sensitive area that is sensitive to and operable to detect stress. In general, a MEMS area may be referred to as a sensor area or a stress-sensitive area of the substrate 10 at which a stress-sensitive sensor is integrated at the substrate 10.

The chip 100 further includes a stress-decoupling feature made of one or more stress-decoupling trenches 20. Each stress-decoupling trench 16 is laterally spaced from the MEMS element 12, extends from the main surface 11 of the substrate 10 into the substrate 10, and extends partially through the substrate 10. In other words, the trenches 20 do not extend completely through the substrate 10. The trenches 20 may be formed, for example, by a frontside etching technique.

The trenches 20 define a vertical boundary between an inner or a first region 22 of the chip 100, where the MEMS element 12 is provided, and one or more peripheral or second regions 23 of the chip 100. The trenches 20 are configured to decouple any mechanical stress coming from, for example, the package of the chip 100 from being transferred to the MEMS element 12. That is, the trenches 20 are configured to reduce any mechanical stress present in the peripheral region 22 of the chip 100 from being transferred to the inner region 21 of the chip 100, and ultimately to the MEMS element 12. Thus, the stress-decoupling feature shields the MEMS element 12 from external mechanical influences and thereby prevents a shift in a sensor signal produced by the MEMS element 12, or a stress-sensitive sensor, due these influences.

In this example, trenches 20 may be a single, continuous trench 20 that partially or entirely surrounds the periphery of the first region 22 of the substrate 10 at which the MEMS element 12 is integrated. This first region 22 may also be referred to as a MEMS area or a stress-sensitive area of the substrate 10. For example, a stress-sensitive area 10b, shown in FIG. 1B, is defined by the surrounding trench 20. A stress-sensitive area.

Thus, whether the trench 20 is formed from one or more trenches, the trench 20 surrounds at least a portion of the stress-sensitive area in order to target stress-decoupling of this area.

The chip 100 further includes a plurality of particle filter trenches 27 that are formed at the second main surface 21 (i.e, the backside) of the substrate 10. Thus, both stress-decoupling structures 20 and particle filter trenches 27 are integrated into a single substrate (i.e., a single semiconductor wafer). The particle filter trenches 27 protect the decoupling trenches 20, as well as the stress-sensitive sensors 12, from foreign particles. In particular, the particle filter trenches 27 prevent particles from reaching (and blocking) stress decoupling trenches. A width of the particle filter trenches and an angle at which they are arranged defines the allowed size of particles passing therethrough. The particle filter trenches 27 also provide a backside pressure coupling.

The particle filter trenches 27 are lateral trenches or cavities that partially extend laterally (i.e., having a longitudinal axis in the x-direction) along the second main surface 21. Each particle filter trenches 27 is transverse to an intersecting portion of a respective trench 20. Specifically, in the cross-section shown in FIG. 1A, if the trenches 20 are said to have a vertical extension along the y-axis, a longitudinal extension along the z-axis, and a transversal extension in the x-axis, then a longitudinal extension of each particle filter trench 27 extends orthogonal to the vertical extension of its respective trench 20 and parallel to the transversal extension of its respective trench 20. The longitudinal extension of each particle filter trench 27 may also extend orthogonal to the longitudinal extension of its respective trench, or at some other angle greater than zero degrees. That is, the each particle filter trench 27 may be obliquely arranged such that its longitudinal extension is at an angle between the x-axis and the z-axis, instead of being arranged solely along the x-axis or z-axis, as shown in FIG. 1B. The angle at which this longitudinal extension of the particle filter trench helps to defines the allowed size of particles passing therethrough.

The particle filter trenches 27 may be formed, for example, by a backside lithography and etching technique.

Each particle filter trench 27 intersects with an end portion of the respective trench 20 such that an opening from the frontside formed by the trench 20 intersects with an opening from the backside formed by the particle filter trench 27. From a top-view perspective, particle filter trench 27 and its respective trench 20 form a cross-pattern or an X-pattern, depending on the angle of traversal. The intersecting portion of the particle filter trench 27 and its respective trench 20 is a portion at which the two openings conjoin, forming a pressure coupling opening 28 that extends entirely from the first main surface 11 to the second main surface 21. The pressure coupling opening 28 forms an open pathway that provides a backside pressure coupling.

In addition, a plurality of particle filter trenches 27 are provided, spaced apart from each other, along the longitudinal extension (i.e., along the z-axis) of the respective trench 20. That is, multiple particle filter trenches 27 are formed parallel to each other along the z-axis, spaced apart from each other by a portion of substrate that extends fully to the second main surface 21. Thus, the substrate 10 is a one-piece integral member whose unitary construction is maintained throughout the entirety of the chip. In other words, two or more substrates are not used, nor is a single substrate broken into multiple parts by trenches or cavities.

Furthermore, it is noted that a underside 21a of part of the substrate 10 is exposed by the particle filter trenches 27. This feature is shown in FIGS. 1A and 1C. This underside portion 21a represents an area where a particle filter trench 27 is in contact with the substrate 10.

Figure 2:
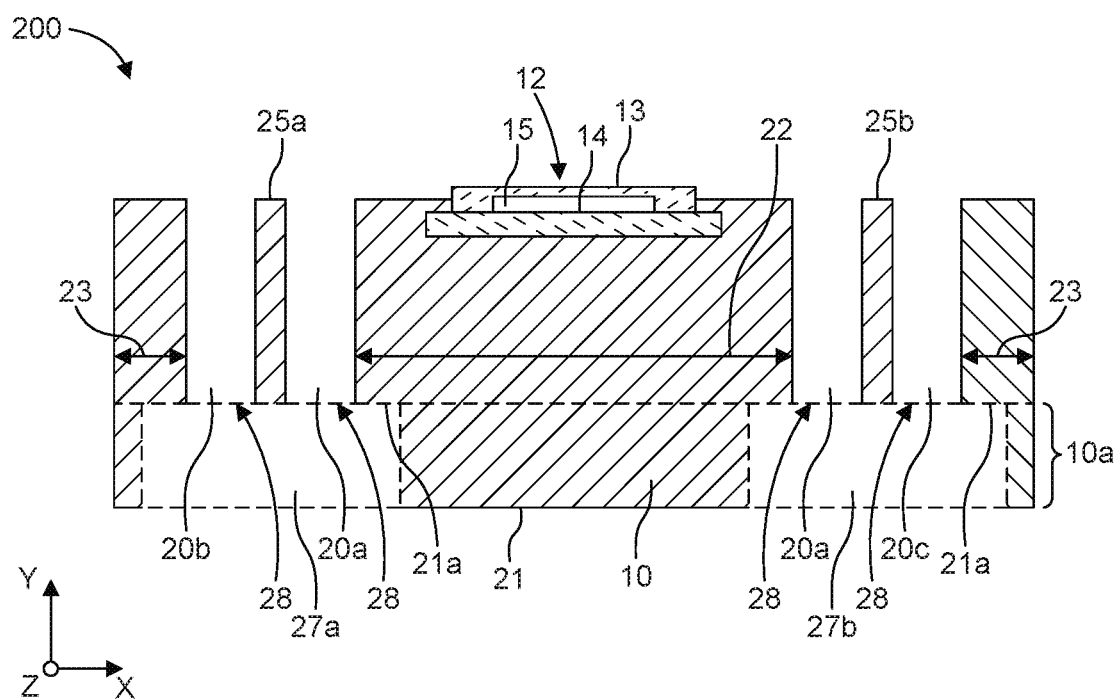
FIG. 2 shows a cross-sectional diagram of a chip according to one or more embodiments.

FIG. 2 shows a cross-sectional diagram of a chip 200 (e.g., a sensor chip) according to one or more embodiments. Similar to chip 100, the chip 200 includes a semiconductor substrate 10 (e.g., a silicon substrate) having a first main surface 11 at the frontside of the chip 100 and a second main surface 21 at the backside of the chip 10, opposite to the frontside. The chip further includes a MEMS element 12 integrated at the main surface 11.

The chip 200 further includes a stress-decoupling feature made of one or more stress-decoupling trenches 20a, 20b, and 20c, collectively referred to as stress-decoupling trenches 20. Each stress-decoupling trench 20 is laterally spaced from the MEMS element 12, extends from the main surface 11 of the substrate 10 into the substrate 10, and extends partially through the substrate 10. In other words, the trenches 20 do not extend completely through the substrate 10. Thus, the trenches 20 terminate in the silicon of a single wafer that includes the MEMS element 12.

The trenches 20 define a vertical boundary between an inner or a first region 22 of the chip 100, where the MEMS element 12 is provided, and one or more peripheral or second regions 23 of the chip 200. The trenches 20 are configured to decouple any mechanical stress coming from, for example, the package of the chip 200 from being transferred the MEMS element 12. That is, the trenches 20 are configured to reduce any mechanical stress present in the peripheral region 23 of the chip 200 from being transferred to the inner region 22 of the chip 100, and ultimately to the MEMS element 12. Thus, the stress-decoupling feature shields the MEMS element 12 from external mechanical influences and thereby prevents a shift in a sensor signal produced by the MEMS element 12 or stress-sensitive sensor due these influences.

As noted above, each trench 20 extends partially, but not completely through the substrate 10. For example, the trenches 20 may have a depth of approximately 325-375 µm. In particular, the depth of the trenches 20 is in the order of a distance between adjacent trenches that envelop the MEMS element 12 or deeper. As such, the formation of the trenches 20 in the substrate 10 is exclusive to frontside trenching. A backside portion 10a is a portion of the substrate 10 that extends from the main surface 21 at the backside of the chip 10 to the bottom of the deepest trench 20.

As a result of the backside portion 10a remaining intact as a single member, and like the substrate 10 in chip 100, the substrate 10 in chip 200 is a one-piece integral member whose unitary construction is maintained throughout the entirety of the chip. In other words, two or more substrates are not used, nor is a single substrate broken into multiple parts by trenches or cavities.

The stress-sensitive region 22 of the substrate 10 at which the MEMS element 12 is arranged extends vertically from the main surface 11 and is integrally formed with the backside portion of the substrate 10.

One or more of the trenches may envelope the MEMS element 12. For example, trench 20a may be a single, continuous trench that encircles the MEMS element 12. Similarly, trenches 20b and 20c, each adjacent to trench 20a, may together form a single, continuous trench that encircles the MEMS element 12.

Alternatively, trench 20b may envelop a different MEMS element (not illustrated) that is laterally disposed from MEMS element 12 in a different MEMS area of the chip 200. Similarly, trench 20c may envelop a further different MEMS element (not illustrated) that is laterally disposed from MEMS element 12 in a further different MEMS area of the chip 200. Thus, the chip 200 may include one or more different MEMS areas, each of which includes a different MEMS element 12 integrated with the substrate 10, where each MEMS element 12 includes one or more sensitive areas operable for detecting pressure and/or stress.

Additionally or alternatively, one or both trenches 20b and 20c may extend from first lateral side of the substrate 10 to a second lateral side of the substrate 10 that is opposite to the first lateral side.

In addition, a spring structure 25 (e.g., spring structure 25a or 25b) is formed between two adjacent trench segments and is configured to absorb external stress from the environment such that the amount of the external stress transferred to the inner region 22 (i.e., to the MEMS element 12) is reduced or prevented. The external stress may be caused by the package itself (e.g., due to thermal mismatch). Two trenches or trench segments that are adjacently arranged on a same lateral side of the MEMS element 12 so as to form a spring structure 25 therebetween may be referred to as "adjacent" or "neighboring" trenches. Thus, a spring structure 25 is formed between a pair of adjacent trenches 20.

A spring structure 25 is defined as a portion of the substrate 10, arranged between two adjacent trenches 20 or between two laterally separated portions of a same trench 20, that extends from an upper portion of the backside portion 21a towards the first main surface 11 at the frontside of the chip 200. In other words, a spring structure 25 forms the sidewalls of two adjacent trenches 20 or adjacent trench segments. In some embodiments, a spring structure 25 may extend to the first main surface 11 at the frontside of the chip 200. The two adjacent trenches 20 or the two laterally spaced portions of a same trench 20 extend parallel to each other such that the spring structure 25 is formed therebetween.

In this example, a spring structure 25a is formed between trenches 20a and 20b and a spring structure 25b is formed between trenches 20a and 20c. Spring structures 25a and 25b may separate members or may be a single member of unitary construction, for example, if trenches 20b and 20c form a single trench that is concentric to trench 20a.

Furthermore, each spring structure 25 may be electrically coupled to a respective MEMS element 12, and configured to receive a sensor signal (e.g., an electrical signal) generated by at least one sensitive area of the respective MEMS element 12 and provide an electrical path to a sensor circuit that is configured to read out the sensor signal.

All spring structures 25 of the chip are conjoined by a backside portion of the substrate 10, which is of a one-piece integral construction.

The chip 200 further includes a plurality of particle filter trenches 27 (e.g., particle filter trenches 27a and 27b) that are formed at the second main surface 21 (i.e., the backside) of the substrate 10 such that they are integrally formed with the backside portion 10a. The particle filter trenches 27 are arranged similarly to those described in reference to FIGS. 1A-1C, with the exception that the longitudinal extension of each particle filter trench 27 may span two or more trenches 20. For example, particle filter trenches 27a transversely spans across trenches 20a and 20b, while particle filter trenches 27b transversely spans across trenches 20a and 20c.

Specifically, each particle filter trench 27 intersects with an end (i.e., bottom) portion of one or more respective trenches 20 or respective trench segments of a trench 20 such that openings from the frontside formed by the trench 20 intersects with an openings from the backside formed by the particle filter trench 27. From a top-view perspective, each particle filter trench 27 and its respective trench 20 form a cross-pattern or an X-pattern, depending on the angle of traversal. The intersecting portion of the particle filter trench 27 and its respective trench 20 is a portion at which the two openings conjoin, forming a pressure coupling opening 28 that extends entirely from the first main surface 11 to the second main surface 21. The pressure coupling opening 28 forms a pathway that provides a backside pressure coupling.

In addition, a plurality of particle filter trenches 27 are provided, spaced apart from each other, along the longitudinal extension (i.e., along the z-axis) of the respective trench 20. That is, multiple particle filter trenches 27 are formed parallel to each other along the z-axis, spaced apart from each other by a portion of substrate that extends fully to the second main surface 21. Thus, the substrate 10 is a one-piece integral member whose unitary construction is maintained throughout the entirety of the chip. In other words, two or more substrates are not used, nor is a single substrate broken into multiple parts by trenches or cavities.

Furthermore, it is noted that a underside 21a of part of the substrate 10 is exposed by the particle filter trenches 27. This underside portion 21a represents an area where a particle filter trench 27 is in contact with the substrate 10.

Figure 3A:
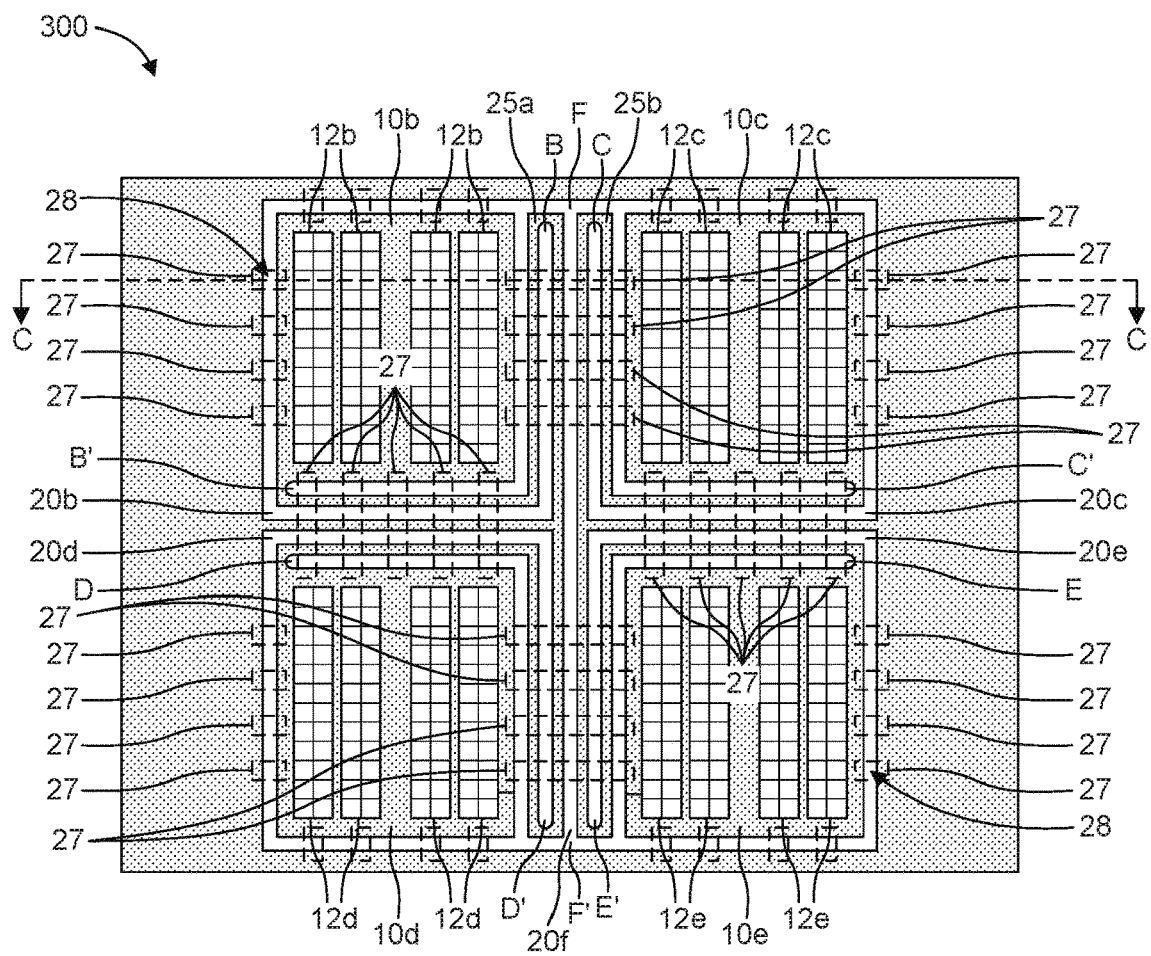
FIG. 3A shows a top-view diagram of a chip according to one or more embodiments.
Figure 3B:
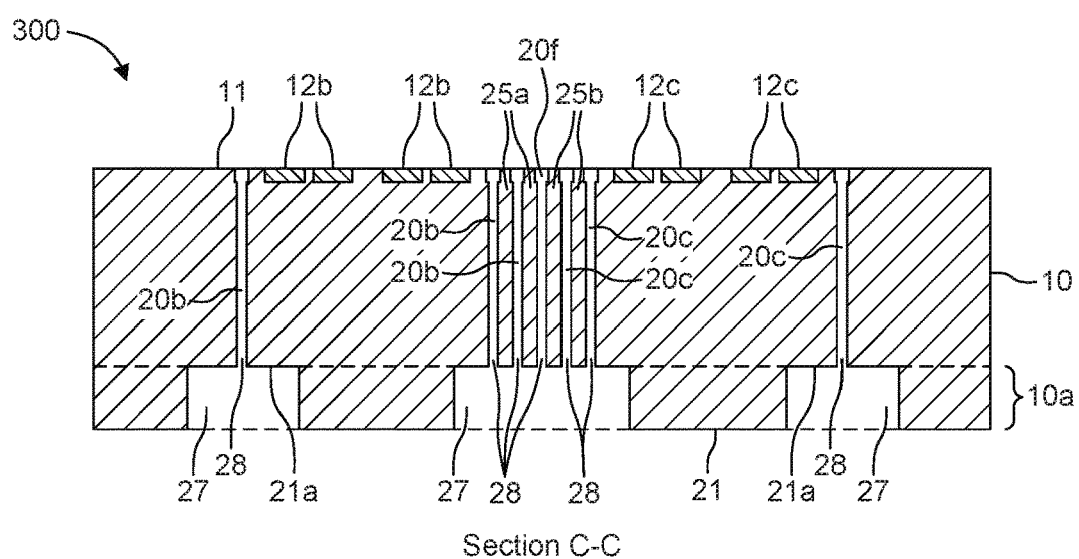
FIG. 3B shows a cross-sectional diagram of the chip taken along line C-C shown in FIG. 3A.

FIG. 3A shows a top-view diagram of a chip 300 according to one or more embodiments. Shading has been provided to indicate a first main surface 11 of the substrate and is used merely to assist in distinguishing the first main surface 11 from trenches 20. Additionally, FIG. 3B shows a cross-sectional diagram of chip 300 taken along line C-C shown in FIG. 3A. In particular, the substrate 10 includes four MEMS areas 10b, 10c, 10d, and 10e at which different MEMS elements area integrated at the first main surface 11. In this example, each MEMS element includes four sensitive areas laterally separated from each other and arranged in a grid formation. Each sensitive area is configured to generate an electrical signal in response to a detected pressure and/or stress. The electrical signals generated by the sensitive areas of a MEMS element may be added or averaged together by the sensor circuit.

As can bee seen in FIG. 3A, MEMS area 10b includes a MEMS element that includes sensitive areas 12b, MEMS area 10c includes a MEMS element that includes sensitive areas 12c, MEMS area 10d includes a MEMS element that includes sensitive areas 12d, and MEMS area 10e includes a MEMS element that includes sensitive areas 12e. Each MEMS area may have a rectangular shape.

In addition, a plurality of trenches 20 are formed between adjacent or neighboring MEMS areas 10b-10e. Moreover, a trench 20 or a segment of a trench 20 is also formed around a peripheral region of the MEMS areas 10b-10e, between the MEMS area and the lateral edges of the chip 300. Furthermore, one or more trenches 20 may be conjoined to form a single, continuous trench.

Spring structures 25 (e.g., spring structures 25a and 25b) are formed between two adjacent trenches 20 or between two laterally separated portions of a same trench 20.

The plurality of trenches 20 includes trench 20b that encircles MEMS area 10b. In particular, trench 20b includes a first end B and a second end B'. Thus, in this example, trench 20b wraps around the MEMS area 10b 1.5 times such that one trench segment is formed by trench 20b at the outer peripheral edges (i.e., those edges neighboring an edge of the chip 300) of the MEMS area and two trench segments are formed by trench 20b at the inner peripheral edges (i.e., those edges not neighboring an edge of the chip 300, or rather those edges that are most proximate to adjacent MEMS areas 10c and 10d).

As a result, a pair of adjacent stress-decoupling trenches or trench segments are formed from one lateral side of the MEMS area 10b by a single, continuous trench 20b that encircles the MEMS area 10b such that at least a portion of the single, continuous trench overlaps with itself in a lateral direction. Such an arrangement may occur when the single, continuous trench 20b has a spiral pattern that winds around the MEMS area 10b, with a spring structure 25 formed between laterally overlapping segments of the trench 20b. It naturally follows that the spring structure 25 may also have a spiral pattern that is congruent with the spiral pattern of the single, continuous trench 20b.

Similar to trench 20b, trench 20c includes a first end C and a second end C'. Thus, in this example, trench 20c wraps around the MEMS area 10c 1.5 times such that one trench segment is formed by trench 20c at the outer peripheral edges (i.e., those edges neighboring an edge of the chip 300) of the MEMS area and two trench segments are formed by trench 20c at the inner peripheral edges (i.e., those edges not neighboring an edge of the chip 300, or rather those edges that are most proximate to adjacent MEMS areas 10b and 10e).

Similar to trench 20b, trench 20d includes a first end D and a second end D'. Thus, in this example, trench 20d wraps around the MEMS area 10d 1.5 times such that one trench segment is formed by trench 20d at the outer peripheral edges (i.e., those edges neighboring an edge of the chip 300) of the MEMS area and two trench segments are formed by trench 20d at the inner peripheral edges (i.e., those edges not neighboring an edge of the chip 300, or rather those edges that are most proximate to adjacent MEMS areas 10b and 10e).

Similar to trench 20b, trench 20e includes a first end E and a second end E'. Thus, in this example, trench 20e wraps around the MEMS area 10e 1.5 times such that one trench segment is formed by trench 20e at the outer peripheral edges (i.e., those edges neighboring an edge of the chip 300) of the MEMS area and two trench segments are formed by trench 20e at the inner peripheral edges (i.e., those edges not neighboring an edge of the chip 300, or rather those edges that are most proximate to adjacent MEMS areas 10c and 10d).

Trench 20f includes a first end F and a second end F' such that the trench 20f extends laterally from one edge of the chip 300 to a second edge of the chip 300 that is opposite to the first edge of the chip. Trench 20f may also be formed to unite with trenches 20b-20d, forming a single, continuous trench.

As such, five trenches 20 are formed laterally between MEMS areas 10b and 10c, with four spring structures 25 formed laterally therebetween. In this case, there are five pairs of adjacent trenches arranged laterally between MEMS areas 10b and 10c, which results in the four spring structures 25 (i.e., each pair has a corresponding spring structure 25 arranged therebetween).

In addition, five trenches 20 are formed laterally between MEMS areas 10d and 10e, with four spring structures 25 formed laterally therebetween; four trenches 20 are formed laterally between MEMS areas 10b and 10d, with three spring structures 25 formed laterally therebetween; and four trenches 20 are formed laterally between MEMS areas 10c and 10e, with three spring structures 25 formed laterally therebetween. The spring structures 25 are configured to absorb external stress from the environment such that each MEMS area 10b-10e, and thus each sensitive area of the MEMS elements, is insulated from the external stress.

The chip 300 further includes a plurality of particle filter trenches 27 that are formed at the second main surface 21 (i.e, the backside) of the substrate 10 such that they are integrally formed with the backside portion 10a. The particle filter trenches 27 are arranged similarly to those described in reference to FIGS. 1A-1C, with the exception that the longitudinal extension of each particle filter trench 27 may span one or more trenches 20.

Specifically, each particle filter trench 27 intersects with an end portion of one or more respective trenches 20 such that openings from the frontside formed by the trench 20 intersects with an openings from the backside formed by the particle filter trench 27. As can be seen, multiple particle filter trenches 27 may also extend between MEMS areas 10b-10e, transversely spanning the trenches 20 formed therebetween.

From a top-view perspective, each particle filter trench 27 and its respective trench 20 form a cross-pattern or an X-pattern, depending on the angle of traversal. The intersecting portion of the particle filter trench 27 and its respective trench 20 is a portion at which the two openings conjoin, forming a pressure coupling opening 28 that extends entirely from the first main surface 11 to the second main surface 21. The pressure coupling opening 28 forms a pathway that provides a backside pressure coupling.

Figure 4A:
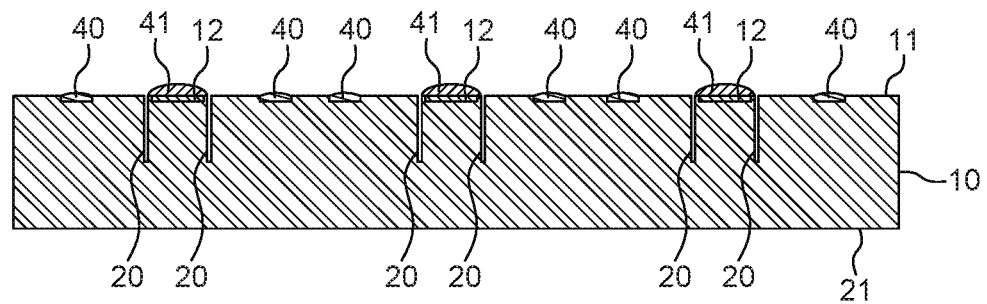
FIGS. 4A-4D show cross-sectional views that illustrate a manufacturing process of integrated stress-sensitive sensors according to one or more embodiments.

FIGS. 4A-4D illustrate cross-sectional views of a manufacturing process of integrated stress-sensitive sensors according to one or more embodiments. In particular, FIG. 4A illustrates a frontend fabrication step that includes integrating a plurality of stress-sensitive sensors 12 in a substrate 10 (i.e., a semiconductor wafer), forming stress-decoupling trenches 20, and forming contact pads 40. The stress-sensitive sensors 12 may be MEMS pressure sensors or some other stress-sensitive sensor, as described above.

The contacts pads 40 are laterally spaced on the first main surface 11 from the trenches 20, and further laterally spaced from a respective stress-sensitive sensor 12 to which the contact pad is electrically connected.

In addition, an optional protective material 41 may be disposed over each stress-sensitive sensors 12. The protective material 41 may be used for particle protection.

Figure 4B:
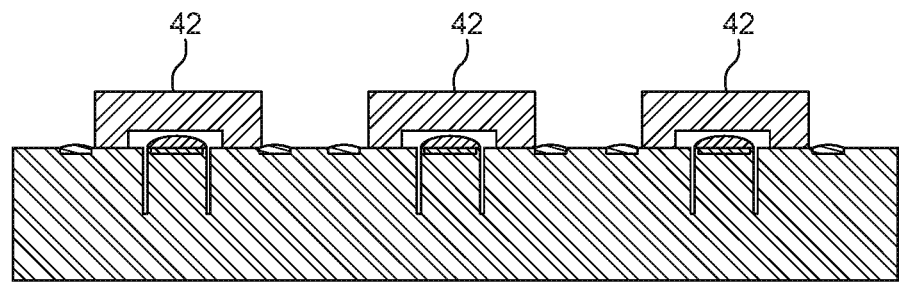

Next, FIG. 4B illustrates a lid attachment step during which a protective cap 42 is disposed over a respective stress-sensitive sensor 12. The protective cap 42 may include a frame that is bonded to the first main surface 11 of the substrate 10 and a lid that extends over and encapsulates the respective stress-sensitive sensor 12. The frame of the protective cap 42 may be bonded to the substrate 10 in an area between a stress-decoupling trench 20 and a contact pad 40. The protective cap 42 may be made of SU8 and/or glass. For example, the frame portion may be made of SU8 and the lid portion may be made of SU8 or glass.

Figure 4C:
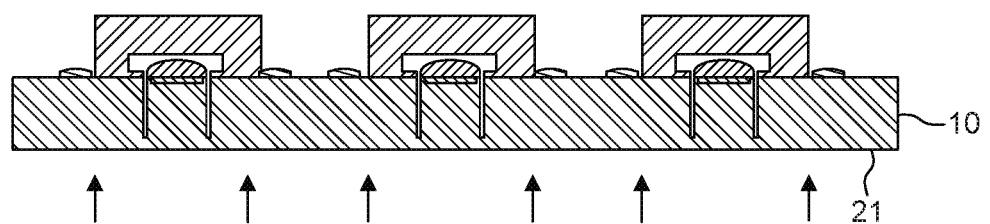

Next, FIG. 4C illustrates a grinding or a wafer thinning process is applied to the backside of the substrate 10 to reduce the chip height (i.e., to reduce the thickness of the substrate). The thinning of the substrate 10 is limited such that the stress decoupling trenches 20 remain at a vertical distance from the second main surface 21 (i.e., the backside) of the substrate.

Figure 4D:
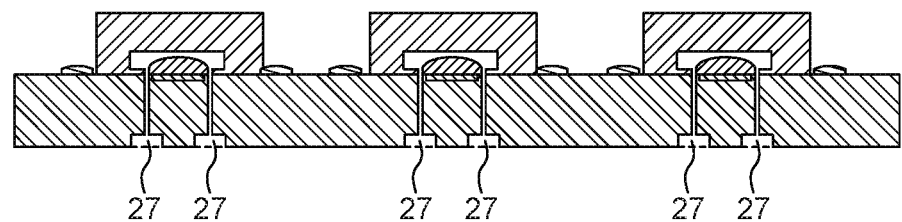

Next, FIG. 4D illustrates a backside lithography and silicon etch process for particle filter trench formation. In other words, it is here where the particle filter trenches 27 are formed. The particle filter trenches 27 protect the decoupling trenches 20, as well as the stress-sensitive sensors 12, from foreign particles. The particle filter trenches 27 also provide a backside pressure coupling.

Following, the particle filter trench formation, individual sensor chips may be formed by dicing (not illustrated).

Figure 5A:
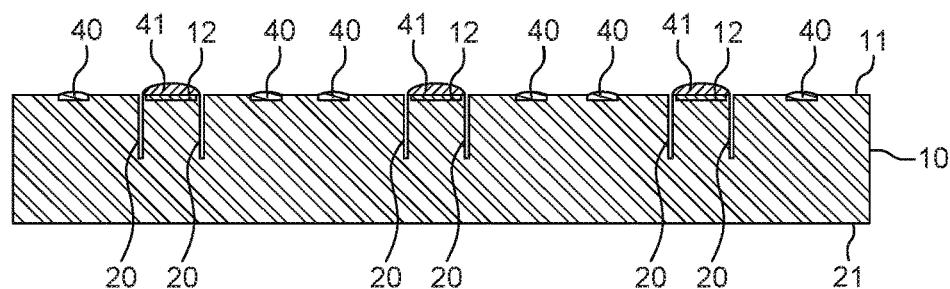
FIGS. 5A-5G show cross-sectional views that illustrate a manufacturing process of integrated stress-sensitive sensors according to one or more embodiments that includes wafer level ball (WLB) grid array integration.

FIGS. 5A-5G illustrate cross-sectional views of a manufacturing process of integrated stress-sensitive sensors according to one or more embodiments that includes wafer level ball (WLB) grid array integration. In particular, FIG. 5A illustrates a frontend fabrication step that includes integrating a plurality of stress-sensitive sensors 12 in a substrate 10 (i.e., a semiconductor wafer), forming stress-decoupling trenches 20, and forming contact pads 40. The stress-sensitive sensors 12 may be MEMS pressure sensors or some other stress-sensitive sensor, as described above.

The contacts pads 40 are laterally spaced on the first main surface 11 from the trenches 20, and further laterally spaced from a respective stress-sensitive sensor 12 to which the contact pad is electrically connected.

In addition, an optional protective material 41 may be disposed over each stress-sensitive sensors 12. The protective material 41 may be used for particle protection.

Figure 5B:
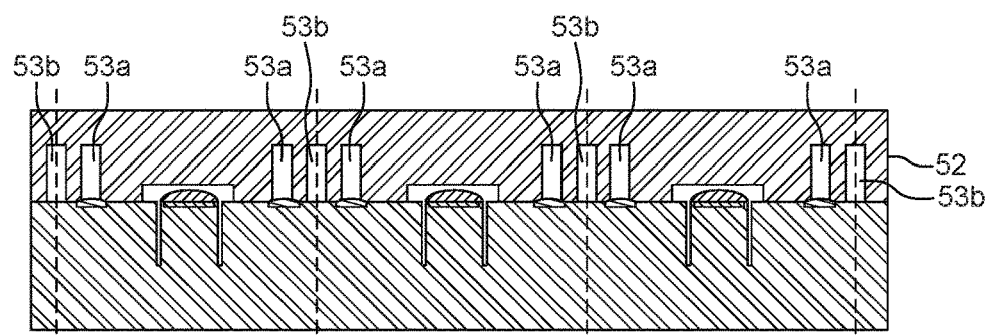

Next, FIG. 5B illustrates a lid attachment step during which a protective cap 52 is disposed over all the stress-sensitive sensors 12 and attached to the main surface 11 of the substrate 10. The protective cap 52 may be a pre-structured interposer, and, more specifically, a pre-structured glass or silicon wafer. If glass, a UV glue may be used as an adhesive for attaching the structure to the substrate.

The protective cap 52 may include cavities or trenches 53 (e.g., trenches 53a and 53) that are disposed over different portions of the first main surface 11. For example, a trench 53a may extend over each contact pad 40. Additionally, a trench 53b may be provided in an area between sensor chips or sensor areas.

Figure 5C:
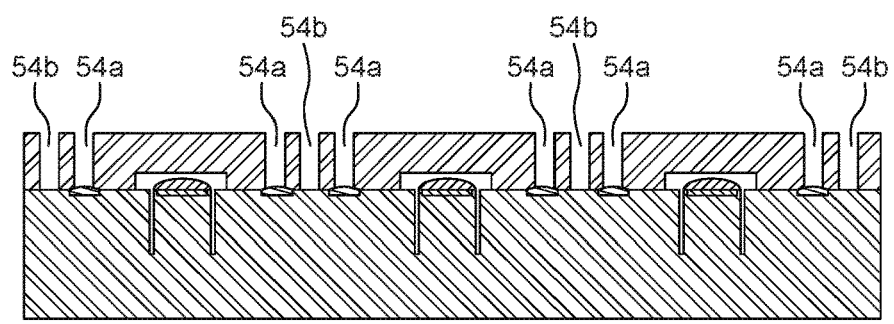

Next, FIG. 5C illustrates a grinding applied to the top-side of the protective cap 52 to expose the trenches 53 to form through holes 54a and 54b that extend through the protective cap.

Figure 5D:
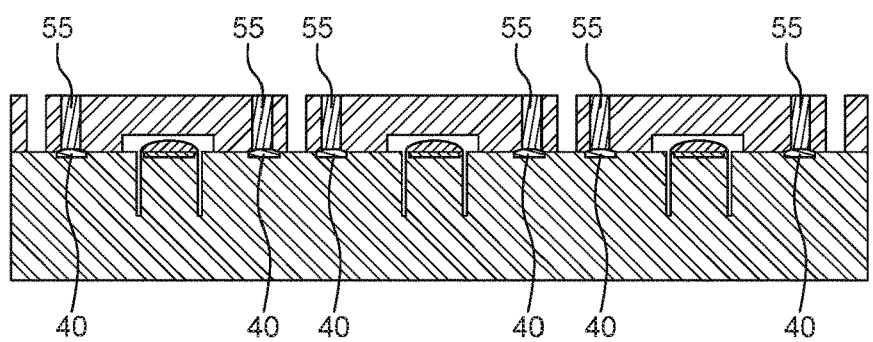

Next, FIG. 5D illustrates a through silicon via (TSV) process during which an electrically conductive fill material 55 is disposed in through holes 54a to form a via in order to make an electrical connection with the contact pads 40.

Figure 5E:
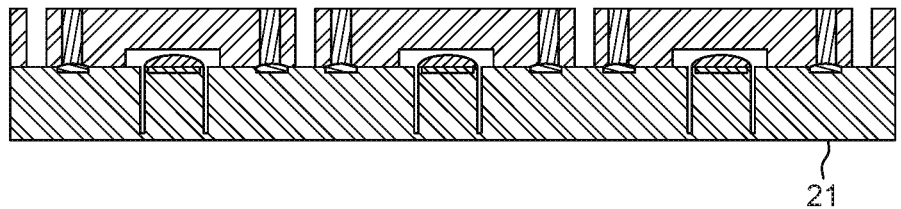

Next, FIG. 5E illustrates a grinding or a wafer thinning process is applied to the backside of the substrate 10 to reduce the chip height (i.e., to reduce the thickness of the substrate). The thinning of the substrate 10 is limited such that the stress decoupling trenches 20 remain at a vertical distance separated from the second main surface 21 (i.e., the backside) of the substrate.

Figure 5F:
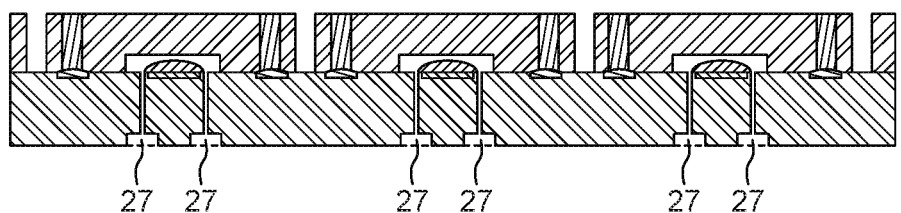

Next, FIG. 5F illustrates a backside lithography and silicon etch process for particle filter trench formation. In other words, it is here where the particle filter trenches 27 are formed. The particle filter trenches 27 protect the decoupling trenches 20, as well as the stress-sensitive sensors 12, from foreign particles. The particle filter trenches 27 also provide a backside pressure coupling.

Figure 5G:
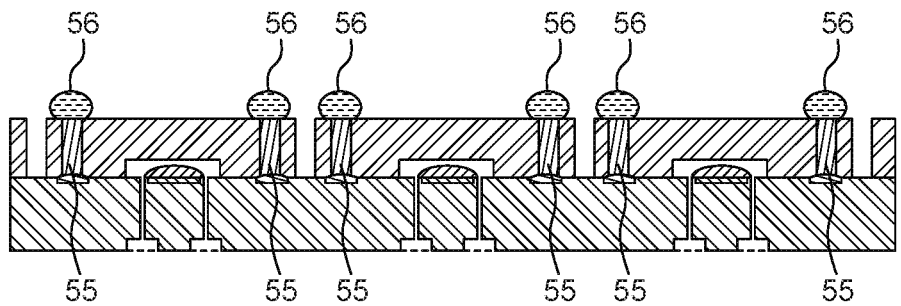

Next, FIG. 5G illustrates applying electrically conductive interconnect structures 56 (e.g., solder balls) on top of the fill material 55 (i.e., vias) such that the interconnect structures 56 are respectively connected to the contact pads 40. In addition, a redistribution layer (RDL) may also be formed prior to forming the interconnect structures 56.

Figure 6A:
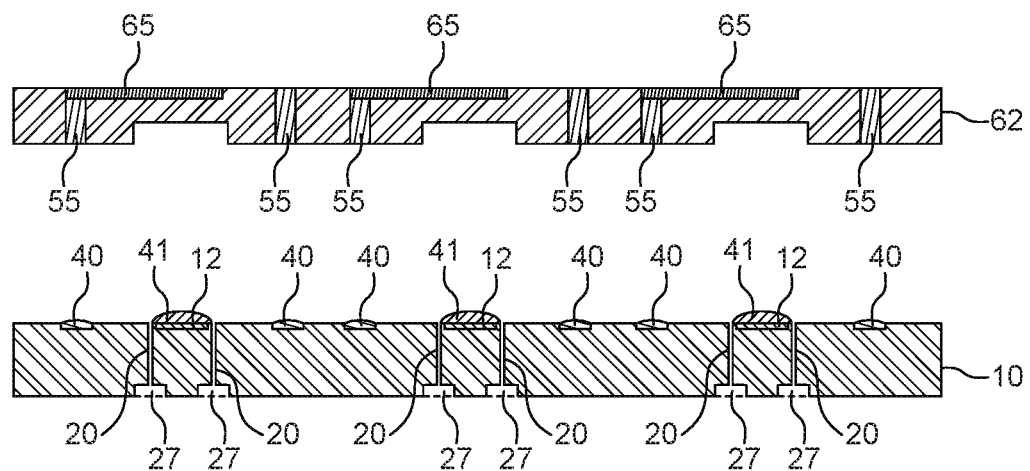
FIGS. 6A and 6B show cross-sectional views that illustrate an alternative manufacturing process of integrated stress-sensitive sensors according to one or more embodiments that includes WLB grid array integration.
Figure 6B:
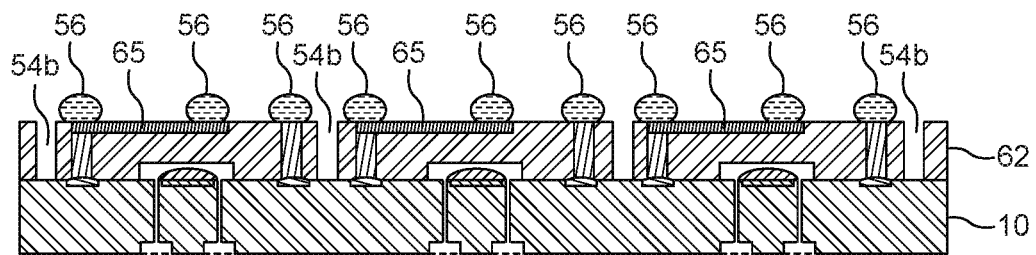

FIGS. 6A and 6B illustrate cross-sectional views of an alternative manufacturing process of integrated stress-sensitive sensors according to one or more embodiments that includes wafer level ball (WLB) grid array integration.

In order to limit the temperature budget for the protective material 41 one could also prepare the semiconductor wafer 10 and the glass interposer 62 separately, and then attach the two wafers together with a short heat up for gluing or via a UV light sensitive glue without an additional high temperature step. A redistribution layer 65 might be introduced and integrated with the glass interposer 62 to efficiently use the chip size and/or to contact the pads 40 and interconnect structures 56.

In particular, the glass interposer 62 may include vias 55 and redistribution layers 65 formed prior to attaching the semiconductor wafer 10 and the glass interposer 62 together. Similarly, semiconductor wafer 10 may include the frontend components as well as the particle filter trenches 27 integrated therewith prior to attaching the semiconductor wafer 10 and the glass interposer 62 together. After attaching the semiconductor wafer 10 and the glass interposer 62 together, the interconnect structures 56 may be provided on the vias 55 and/or redistribution layer 65.

Although embodiments described herein relate to MEMS pressure sensors, and, in some cases capacitive pressure sensors, it is to be understood that other implementations may include other types of stress-sensitive sensors or other types of MEMS devices or MEMS elements. In addition, although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the method steps may be executed by such an apparatus.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

Furthermore, the description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid in the understanding of the principles of the disclosure and the concepts contributed to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof. Thus, it is understood that modifications and variations of the arrangements and the details described herein will be apparent to others skilled in the art.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

What is claimed is:

1. A method of manufacturing a semiconductor device, the method comprising:
    performing a frontend fabrication of a semiconductor substrate having a first surface and a second surface arranged opposite to the first surface, the frontend fabrication including integrating a first stress-sensitive sensor disposed at the first surface of the semiconductor substrate, and forming a first stress-decoupling trench in the semiconductor substrate, wherein the first stress-decoupling trench has a vertical extension that extends from the first surface into the semiconductor substrate, wherein the first stress-decoupling trench vertically extends partially into the semiconductor substrate towards the second surface although not completely to the second surface; and
    forming a plurality of particle filter trenches at the second surface of the semiconductor substrate, wherein the plurality of particle filter trenches vertically extend from the second surface into the semiconductor substrate, wherein each of the plurality of particle filter trenches have a longitudinal extension that extends orthogonal to the vertical extension of the first stress-decoupling trench, and
    wherein each of the plurality of particle filter trenches is separated from an adjacent particle filter trench of the plurality of particle filter trenches by a backside portion of the semiconductor substrate that extends from the second surface to a bottom of the first stress-decoupling trench, and wherein the each of the plurality of particle filter trenches forms a cross-pattern or an X-pattern with the first stress-decoupling trench.

2. The method of claim 1, further comprising:
    attaching a cap to the first surface, wherein the cap encapsulates the first stress-sensitive sensor and the first stress-decoupling trench.

3. The method of claim 2, wherein the frontend fabrication includes forming contact pads on the first surface, and the cap, the first stress-sensitive sensor, and the first stress-decoupling trench are disposed between the contact pads.

4. The method of claim 3, wherein the cap is an interposer that includes conductive vias aligned with the contact pads.

5. The method of claim 1, wherein the first stress-decoupling trench includes the vertical extension along a first axis, a longitudinal extension along a second axis orthogonal to the first axis, and a transversal extension along a third axis orthogonal to the first axis and the second axis, and the longitudinal extension of the plurality of particle filter trenches is arranged at an angle that is parallel to the third axis or at an angle that is between the second axis and the third axis.

6. The method of claim 5, wherein the plurality of particle filter trenches are separated from each other along the second axis.

7. The method of claim 1, wherein each of the plurality of particle filter trenches intersects with the bottom of the first stress-decoupling trench such that the plurality of particle filter trenches conjoin with the first stress-decoupling trench to form a plurality of openings that extend from the first surface to the second surface.

8. The method of claim 1, further comprising:
    forming a second stress-decoupling trench adjacent to the first stress-decoupling trench, the second stress-decoupling trench having a vertical extension that extends from the first surface into the semiconductor substrate, wherein the second stress-decoupling trench vertically extends partially into the semiconductor substrate towards the second surface although not completely to the second surface,
    wherein the longitudinal extension of each of the plurality of particle filter trenches transversely spans across the first stress-decoupling trench and the second stress-decoupling trench.

9. The method of claim 8, wherein the each of the plurality of particle filter trenches intersects with the second stress-decoupling trench in a cross pattern or an X-pattern.

* * * * *